United States Patent
Forrest et al.

(10) Patent No.: US 12,185,557 B2
(45) Date of Patent: Dec. 31, 2024

(54) OPTOELECTRONIC DEVICE INCLUDING ULTRATHIN DOPANT LAYERS

(71) Applicant: The Regents of the University of Michigan, Ann Arbor, MI (US)

(72) Inventors: Stephen R. Forrest, Ann Arbor, MI (US); Chan Ho Soh, Ann Arbor, MI (US)

(73) Assignee: The Regents of the University of Michigan

( * ) Notice: Subject to any disclaimer, the term of this patent is extended or adjusted under 35 U.S.C. 154(b) by 452 days.

(21) Appl. No.: 17/530,817

(22) Filed: Nov. 19, 2021

(65) Prior Publication Data

US 2022/0181573 A1   Jun. 9, 2022

Related U.S. Application Data

(60) Provisional application No. 63/121,366, filed on Dec. 4, 2020.

(51) Int. Cl.
*H10K 30/80*    (2023.01)
*H10K 50/11*    (2023.01)
*H10K 50/15*    (2023.01)
*H10K 102/00*   (2023.01)

(52) U.S. Cl.
CPC ........... *H10K 30/865* (2023.02); *H10K 50/11* (2023.02); *H10K 50/15* (2023.02); *H10K 2102/351* (2023.02)

(58) Field of Classification Search
CPC ...... H10K 50/11; H10K 30/865; H10K 50/15; H10K 50/131
See application file for complete search history.

(56) References Cited

U.S. PATENT DOCUMENTS

| | | | |
|---|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |

(Continued)

FOREIGN PATENT DOCUMENTS

| | | |
|---|---|---|
| EP | 1238981 | 9/2002 |
| JP | 2010135467 | 6/2010 |

(Continued)

OTHER PUBLICATIONS

Baldo et al., "Highly Efficient Phosphorescent Emission from Organic Electroluminescent Devices," Nature, vol. 395, pp. 151-154 (1998).

(Continued)

*Primary Examiner* — Evan G Clinton
(74) *Attorney, Agent, or Firm* — Riverside Law LLP

(57) ABSTRACT

An optoelectronic device comprises a first electrode; a first host material layer positioned over the first electrode; a second host material layer positioned over the first host material layer; at least one ultrathin dopant layer positioned between the first and second host material layers, the at least one ultrathin dopant layer having a thickness of less than 2

(Continued)

Å; and a second electrode positioned over the second host material layers. Other organic optoelectronic devices are also disclosed.

20 Claims, 12 Drawing Sheets

(56) References Cited

U.S. PATENT DOCUMENTS

| | | | |
|---|---|---|---|
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2013/0026452 | A1 | 1/2013 | Kottas |
| 2013/0119354 | A1 | 5/2013 | Ma |
| 2016/0254475 | A1* | 9/2016 | Tsukamoto .......... H10K 50/165 257/40 |
| 2016/0359128 | A1* | 12/2016 | Tsukamoto ............ H10K 50/15 |
| 2017/0155061 | A1* | 6/2017 | Forrest ................. H10K 85/346 |
| 2018/0019424 | A1* | 1/2018 | Matsunaga ............ H10K 50/00 |
| 2020/0243786 | A1* | 7/2020 | Forrest .................. H10K 50/11 |

FOREIGN PATENT DOCUMENTS

| | | |
|---|---|---|
| WO | 2004111066 A1 | 12/2004 |
| WO | 2008044723 | 4/2008 |
| WO | 2008057394 A1 | 5/2008 |
| WO | 2010011390 A2 | 1/2010 |
| WO | 2010111175 | 9/2010 |

OTHER PUBLICATIONS

Baldo et al., "Very High-Efficiency Green Organic Light-Emitting Devices Based on Electrophosphorescence," Appl. Phys. Lett., vol. 75, No. 1, pp. 4-6 (1999).

Giebing, N. C. et al. Transient analysis of triplet exciton dynamics in amorphous organic semiconductor thin flims. Org. Electron. 2006, 6, 375.

Sun, Y. et al. Management of singlet and triplet excitons for efficient white organic light-emitting devices. Nature 2006, 440, 908.

* cited by examiner

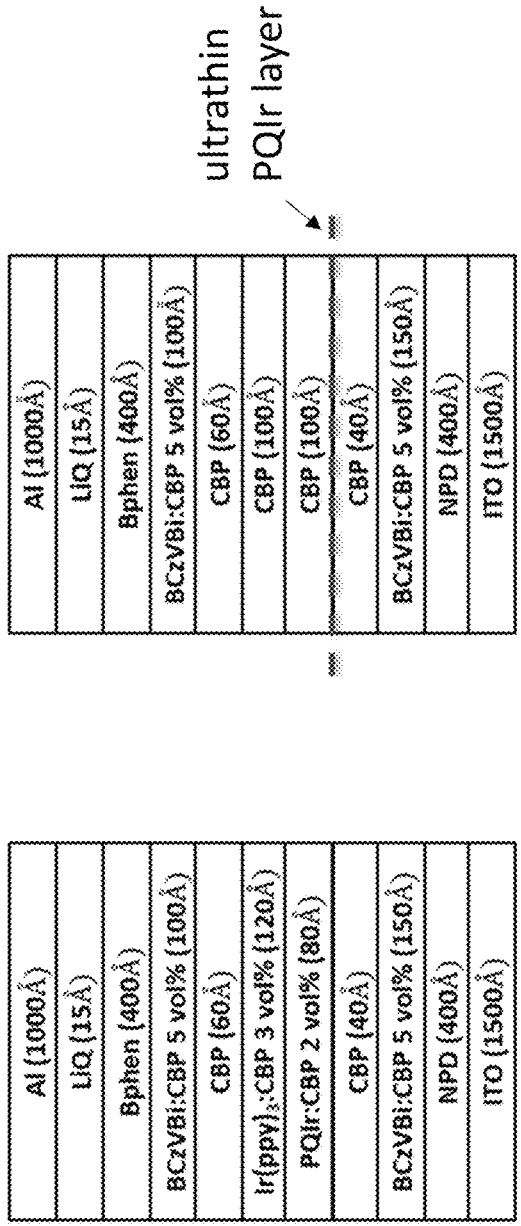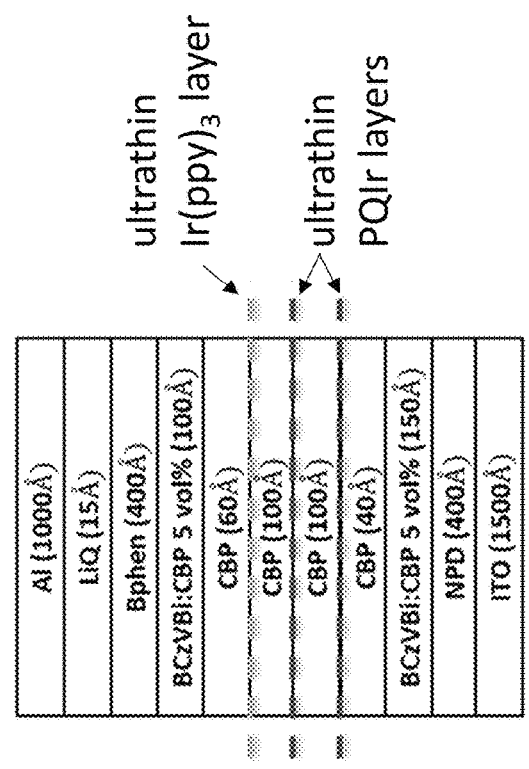
Fig. 7A
Fig. 7B
Fig. 7C

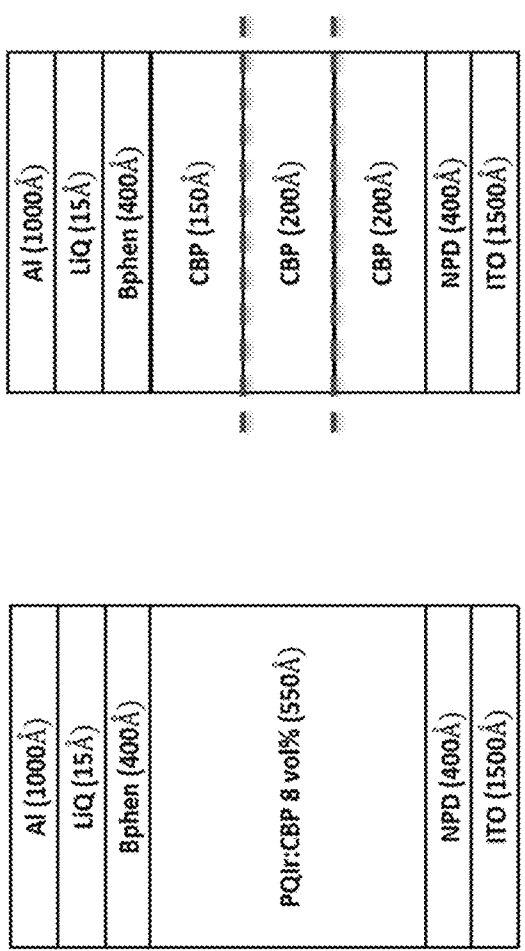
Fig. 12A
Fig. 12B
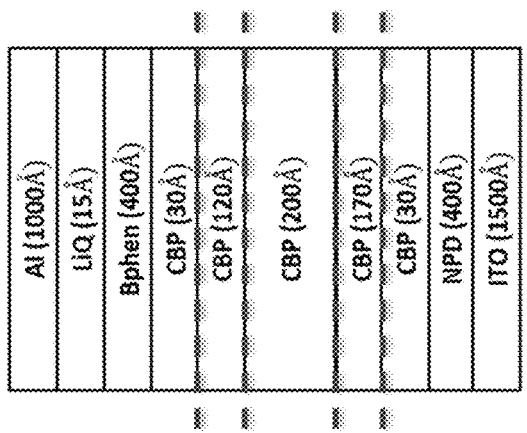
Fig. 12C

OPTOELECTRONIC DEVICE INCLUDING ULTRATHIN DOPANT LAYERS

CROSS REFERENCE TO RELATED APPLICATIONS

This application claims the benefit of U.S. Provisional Patent Application No. 63/121,366 filed on Dec. 4, 2020, which is incorporated herein in its entirety.

STATEMENT REGARDING FEDERALLY SPONSORED RESEARCH OR DEVELOPMENT

This invention was made with government support under DE-EE0008244 awarded by the U.S. Dept. of Energy. The government has certain rights in the invention.

BACKGROUND

Optoelectronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE DISCLOSURE

In one aspect, the present disclosure relates to an organic electroluminescent device, comprising: a first electrode; a first host material layer positioned over the first electrode; a second host material layer positioned over the first host material layer; at least one ultrathin dopant layer positioned between the first and second host material layers, the at least one ultrathin dopant layer having a thickness of less than 2 Å; and a second electrode positioned over the second host material layers.

In one embodiment, the organic electroluminescent device further comprises a third host material layer positioned between the second host material layer and the second electrode; and at least one second ultrathin dopant layer positioned between the second and third host material layers. In one embodiment, the organic electroluminescent device further comprises a hole transport layer positioned between the first electrode and the first host material layer. In one embodiment, the first host material layer has a thickness different from a thickness of the second host material layer. In one embodiment, the first or second host material layer comprises CBP. In one embodiment, the first host material layer comprises multiple host materials.

In one embodiment, the at least one ultrathin dopant layer comprises a first ultrathin dopant layer and a second ultrathin dopant layer. In one embodiment, the first ultrathin dopant layer and a second ultrathin dopant layer comprise different dopant materials. In one embodiment, the first ultrathin dopant layer is in contact with the second ultrathin dopant layer.

In one embodiment, the first electrode is an anode and the second electrode is a cathode. In one embodiment, the anode is a transparent anode. In one embodiment, the at least one dopant layer has a thickness of less than 1 Å.

In one embodiment, the device further comprises a first emissive layer positioned over the first electrode, comprising an emissive layer host material and an emissive layer dopant material, wherein the emissive layer dopant material is different than a dopant in the at least one ultrathin dopant layer. In one embodiment, the first emissive layer is positioned between the first electrode and the first host material layer. In one embodiment, the emissive layer dopant material and the at least one ultrathin dopant layer are each independently selected from the group consisting of a red emissive layer, a blue emissive layer, and a green emissive layer. In one embodiment, The organic electroluminescent device of claim 1, wherein the first host material layer has a thickness of between 3 nm and 4 nm.

In another aspect, the present disclosure relates to an organic electroluminescent device, comprising: a first electrode; a first host material layer comprising a first host material positioned over the first electrode, a light emitting layer positioned over the first host material; and a second host material layer comprising a second host material positioned over the emissive layer; wherein the light emitting layer comprises: n ultrathin dopant layers, each dopant layer having a thickness of at less than 2 Å and comprising a dopant material; and m additional host material layers, each additional host material layer comprising an additional host material; wherein n is an integer of at least 1; and wherein m=n−1 and when m>0, each additional host material layer is positioned between two ultrathin dopant layers.

In one embodiment, n is at least 2 and at least one dopant material is different from at least one other dopant material. In one embodiment, n is at least 2, and each dopant material is the same. In one embodiment, n is 3, 4, or 5.

In another aspect, the present disclosure relates to an organic electroluminescent device, comprising: a first electrode; a second electrode positioned over the first electrode; a layer of host material positioned between the first electrode and the second electrode, having a bottom surface facing the first electrode and a top surface facing the second electrode; and a thin layer of dopant material positioned within the layer of host material, the layer of dopant material having a thickness of less than 2 Å, and positioned at a distance of 20-50 nm from the bottom surface of the layer of host material. In one embodiment, the device further comprises a second thin layer of dopant material positioned within the layer of host material, the second layer of dopant material having a thickness of less than 2 Å and positioned at a distance of 20-50 nm from the top surface of the layer of host material.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which:

FIG. 7A shows an exemplary white OLED with a 200 Å thick phosphor doped region;

FIG. 7B shows an exemplary device with delta-doped PQIr (dashed lines indicate 0.5 Å of PQIr);

FIG. 7C shows an exemplary white OLED with delta-doped phosphors. All three devices shown in FIGS. 7A, 7B, and 7C have the same thickness. Dashed lines indicate 0.5 Å of phosphor emitter;

FIG. 12A shows a conventional red OLED;

FIG. 12B shows an exemplary red OLED with two delta-doped layers;

FIG. 12C shows an exemplary red OLED with four delta-doped layers;

DETAILED DESCRIPTION

Figure 1:
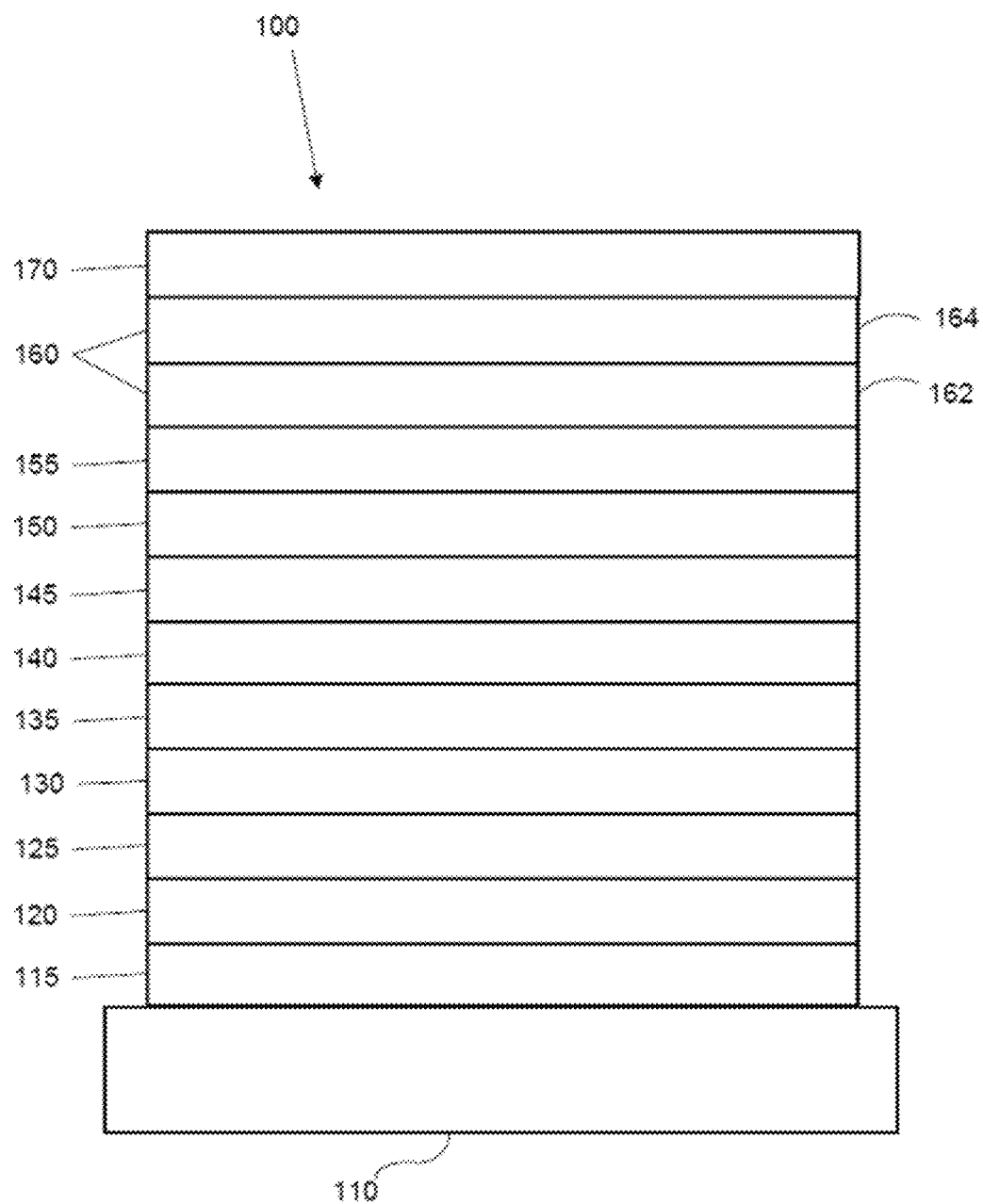
FIG. 1 shows an organic light emitting device.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

As used herein, and as would be understood by one skilled in the art, "HATCN" (referred to interchangeably as HAT-CN) refers to 1,4,5,8,9,11-Hexaazatriphenylenehexacarbonitrile. "TAPC" refers to 4,4'-Cyclohexylidenebis[N,N-bis(4-methylphenyl)aniline]. "B3PYMPM" refers to 4,6-Bis(3,5-di(pyridin-3-yl)phenyl)-2-methylpyrimidine. "BPyTP2" refers to 2,7-Bis(2,2'-bipyridin-5-yl)triphenylene. "LiQ" refers to Lithium Quinolate. "ITO" refers to Indium Tin Oxide. "CBP" refers to 4,4'-Bis(N-carbazolyl)-1,1'-biphenyl. "Ir(ppy)$_2$acac" refers to bis[2-(2-pyridinyl-N)phenyl-C](acetylacetonato)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F$_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
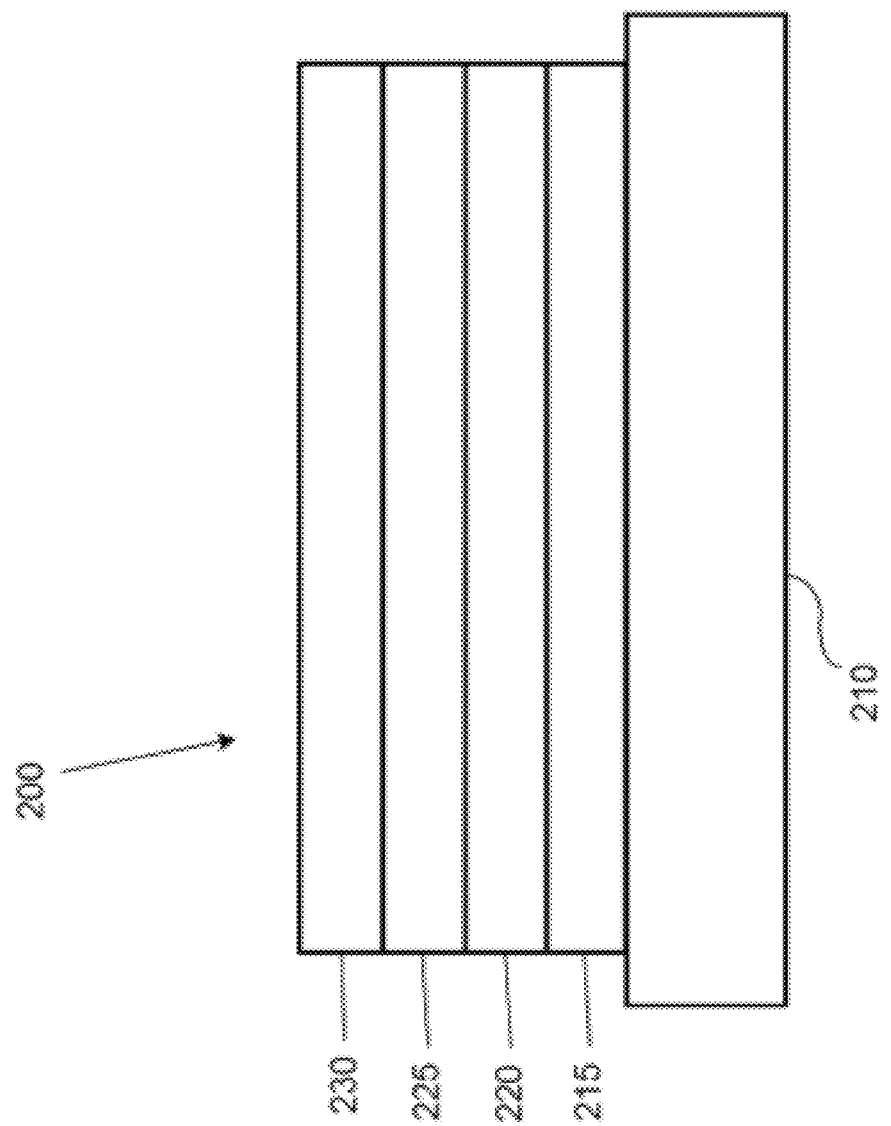
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

Certain embodiments of the disclosure relate to a light emitting device comprising at least one ultrathin dopant layer having a thickness of less than 2 Å. Phosphorescent OLEDs utilize rare earth elements such as iridium or platinum, ultimately increasing their cost posing a limit on the device cost. Replacing the conventional constant doped EML by inserting an ultrathin doping layer, a so-called "delta-doped layer", between neat host layers minimizes material use. The delta-doped layer, ranging from angstroms to nanometers, is spatially separated from the exciton formation zone and harvests diffusing triplets. Devices prepared with delta-doped layers exhibit external quantum efficiency comparable to, or better than, devices employing traditional constantly-doped phosphor layers, while minimizing dopant material use.

Figure 3:
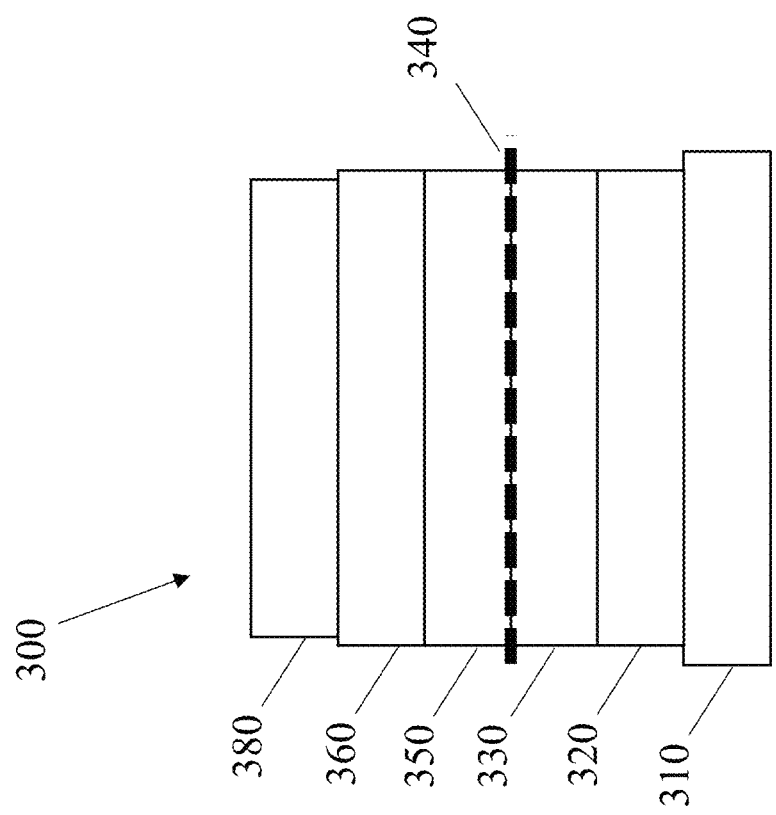
FIG. 3 shows an exemplary organic light emitting device having an ultrathin dopant layer.

With reference to FIG. 3 example reference device 300 is shown. Example device 300 comprises, in order from bottom to top, an anode 310, a hole transporting layer (HTL) 320, a host material layer 330, an ultrathin dopant layer 340, a second host material layer 350, an electron transporting layer (ETL) 360, and a cathode 380. As used herein, the terms electron transport layer and hole blocking layer may be used interchangeably to describe a layer configured to extract and/or transport electrons, for example to minimize charge recombination.

In some embodiments, the device comprises more than one ultrathin dopant layer. In some embodiments, the device comprises at least 1, 2, 3, 4, 5, 6, 7, 8, 9, or 10 ultrathin dopant layers. In one embodiment, the device comprises more than 10 ultrathin dopant layers. In some embodiments, each ultrathin dopant layer is separated by at least one host material layer. In some embodiments, at least one ultrathin dopant layer is in direct contact with at least one other ultrathin dopant layer.

Figure 4:
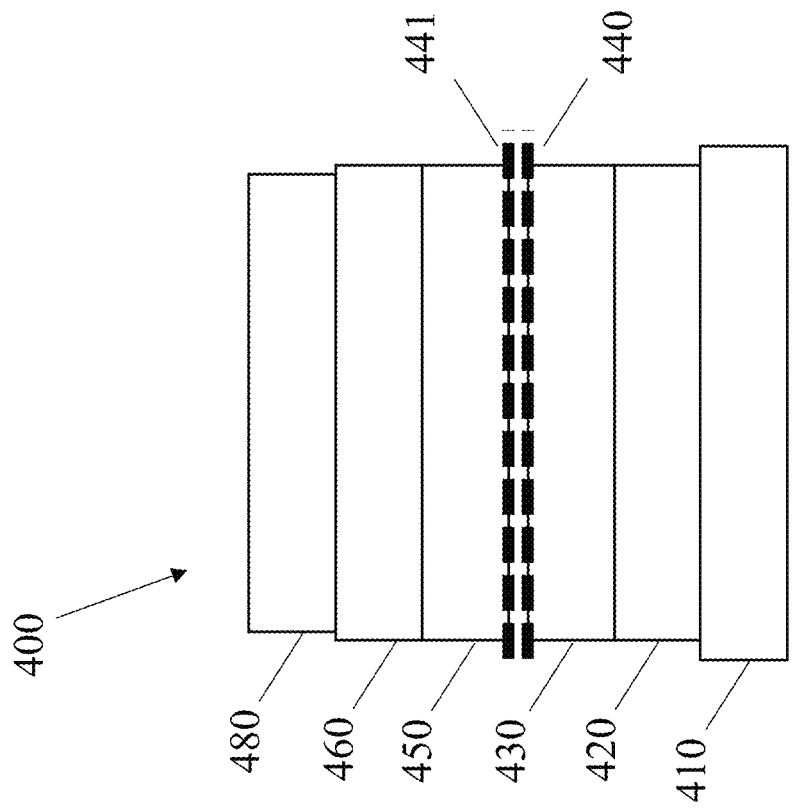
FIG. 4 shows an exemplary organic light emitting device having two consecutive ultrathin dopant layers.

Example reference device 400 comprising two ultrathin dopant layers is presented in FIG. 4. Exemplary device 400 comprises, from bottom to top, an anode 410, HTL 420, a first host material layer 430, a first ultrathin dopant 440, a second ultrathin dopant layer 441, a second host material layer 450, ETL 460, and a cathode 480. In one embodiment, first host material layer 430 and second host material layer 450 comprise the same host material. In one embodiment, first host material layer 430 and second host material layer 450 comprise different host materials. In one embodiment, ultrathin dopant layers 440 and 441 comprise the same emitter material. In one embodiment, ultrathin dopant layers 440 and 441 comprise different emitter materials.

Figure 5:
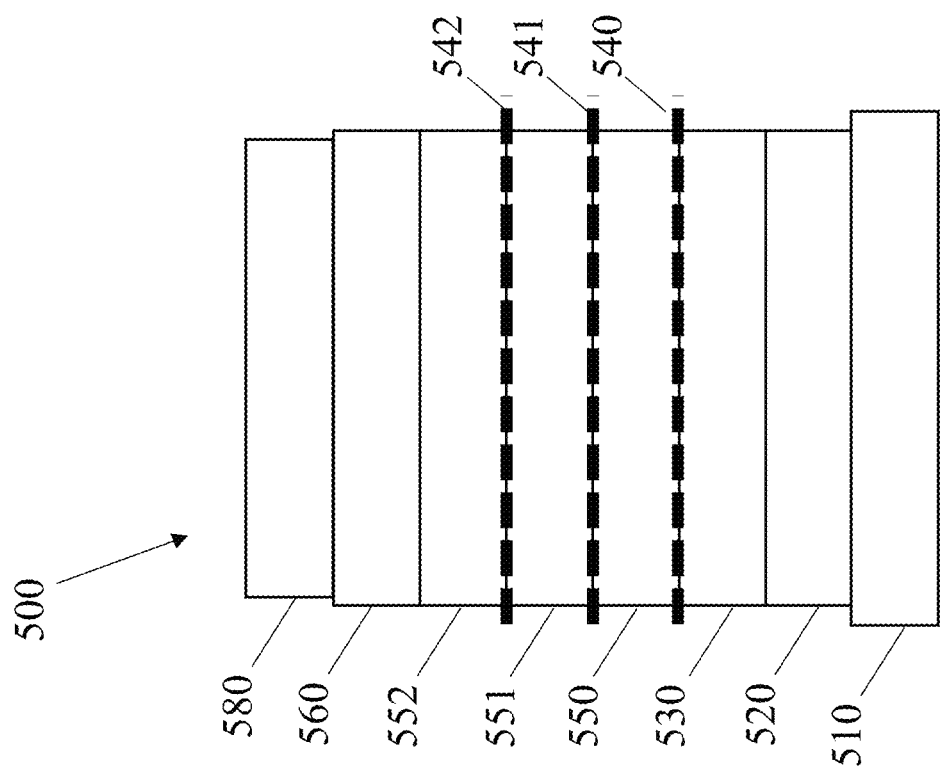
FIG. 5 shows an exemplary organic light emitting device having three ultrathin dopant layers.

Example reference device 500 comprising three ultrathin dopant layers is presented in FIG. 5. Exemplary device 500 comprises, from bottom to top, an anode 510, HTL 520, a first host material layer 530, a first ultrathin dopant 540, a second host material layer 550, a second ultrathin dopant layer 541, a third host material layer 551, a third ultrathin dopant layer 542, a fourth host material layer 552, ETL 560, and a cathode 580. In one embodiment, each of the host material layers independently comprise the same or different host materials. In one embodiment, each of the ultrathin dopant layers independently comprise the same or different emitter materials.

Figure 6:
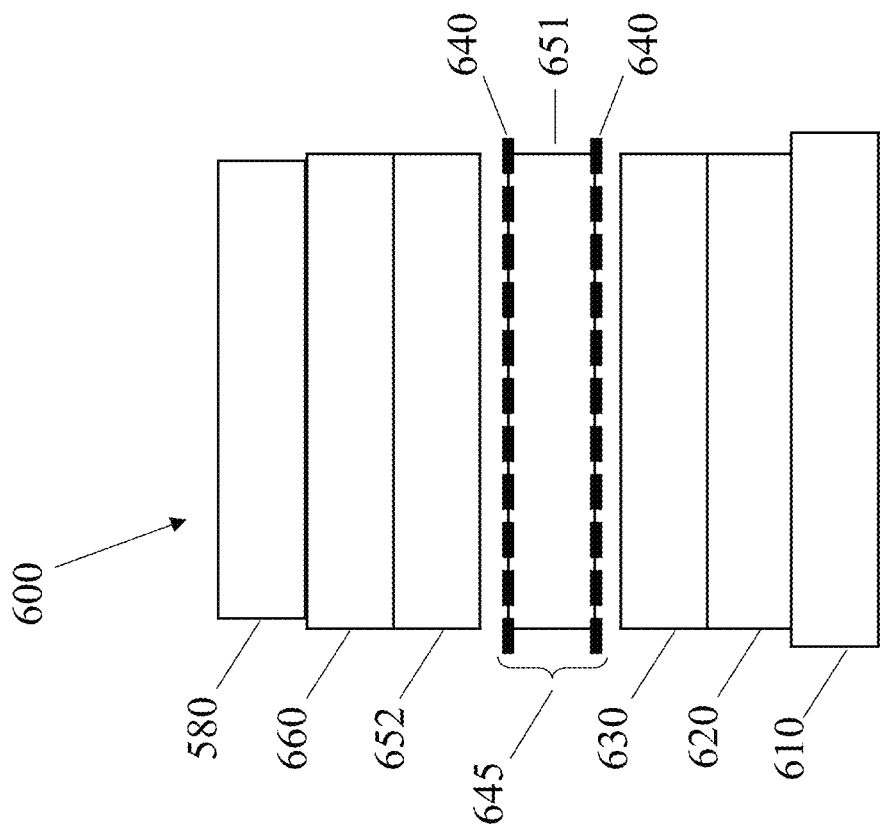
FIG. 6 shows an exemplary organic light emitting device having n ultrathin dopant layers.

Example reference device 600, having n ultrathin dopant layers wherein n is an integer having a value of at least 1, is presented in FIG. 6. Exemplary device 600 contains, from bottom to top, an anode 610, HTL 620, a first host material layer 630, light emitting layer 645, second host material layer 652, ETL 660, and cathode 680. Light emitting layer 645 comprises n ultrathin dopant layers 640 and m additional host layers 651, wherein n is an integer of at least 1; m=n−1, and wherein when m>0, each additional host layer is positioned between two ultrathin dopant layers (The embodiment in which n is 2 and m is 1 is shown in FIG. 6). In one embodiment, when m>1, each of the host material layers independently comprise the same or different host materials. In one embodiment, when n>1, each of the ultrathin dopant layers independently comprise the same or different emitter materials.

The layered structures illustrated in FIG. 3, FIG. 4, FIG. 5, and FIG. 6 are each provided by way of non-limiting example, and it is understood that embodiments of the disclosure may be used in connection with a wide variety of other structures. Functional OLEDs may be achieved by combining the various layers described in different ways, or layers may be omitted entirely, based on design, performance, and cost factors. Other layers not specifically described may also be included.

The anode may comprise any suitable material, including any conductive transparent, semi-transparent, or opaque material or combinations of materials. In one embodiment, the anode comprises indium tin oxide (ITO). In one embodiment, the anode has a thickness of 10-500 nm, 30-300 nm, 50-250 nm, 100-200 nm, 130-170 nm, about 150 nm, or any other suitable thickness.

The hole transporting layer (HTL) may comprise any suitable HTL material. A list of exemplary HTL materials may be found in U.S. Pat. No. 5,294,870, issued Mar. 15, 1994, incorporated herein by reference. In some embodiments, any other suitable materials or combinations thereof may be used. In one embodiment, the HTL comprises N,N'-di(1-naphthyl)-N,N'-diphenyl-(1,1'-biphenyl)-4,4'-diamine (NPD). It is understood that any suitable thickness of the HTL may be used, including but not limited to 2-200 nm, 5-150 nm, 10-75 nm, 35-45 nm, about 40 nm, or any other suitable thickness.

In some embodiments, the device further comprises at least one fluorescent dopant layer. In one embodiment, the at least one fluorescent dopant layer comprises at least one fluorescent dopant. In one embodiment, the at least one fluorescent dopant layer comprises at least one host material. In one embodiment, the at least one fluorescent dopant layer is positioned between the hole transport layer 320, 420, and/or 520 and the first host material later 330, 430, and/or 530. In one embodiment, the at least one fluorescent dopant layer is positioned between the second host material layer 350 or 450 and the electron transporting layer 360 or 460 and. In one embodiment, the at least one fluorescent dopant layer is positioned between the third host material layer 552 and the electron transporting layer 560. In one embodiment, a fluorescent dopant layer is in contact with at least one of a hole transporting layer and an electron transporting layer. In one embodiment, the fluorescent dopant layer comprises a blue emitter. In one embodiment, the fluorescent dopant layer comprises a green emitter. In one embodiment, the fluorescent dopant layer comprises a red emitter. In one embodiment, the fluorescent dopant layer comprises BCzVBi. In one embodiment, the fluorescent dopant layer comprises CBP. In one embodiment, the thickness of the fluorescent dopant layer is between about 1 nm and about 50 nm. In one embodiment, the thickness of the fluorescent dopant layer is between about 5 nm and about 25 nm. In one embodiment, the thickness of the fluorescent dopant layer is between 10 nm and about 15 nm. In one embodiment, the thickness of the fluorescent dopant layer is about 5.0 nm, 7.5 nm, 10.0 nm, 12.5 nm, 15.0 nm, 17.5 nm, 20.0 nm, 22.5 nm, or 25.0 nm.

Each host material layer may independently comprise any suitable host material. In some embodiments, at least one host material layer comprises 4,4'-bis(N-carbazolyl)-1,1'-biphenyl (CBP). The host material in each host material layer may be the same, each host material layer may comprise a different host material, or a combination of same and different host materials may be used. It is understood that any suitable thickness of host material layer may be used, including but not limited to 1-200 nm, 1-100 nm, 1-50 nm, 1-25 nm, 1-20 nm, about 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, or any other suitable thickness.

In one embodiment, the ultrathin dopant layer has a thickness of less than 2.0 Å, less than 2.0 Å, less than 1.9 Å, less than 1.8 Å, less than 1.7 Å, less than 1.6 Å, less than 1.5 Å, less than 1.4 Å, less than 1.3 Å, less than 1.2 Å, less than 1.1 Å, less than 1.0 Å, less than 0.9 Å, less than 0.8 Å, less than 0.7 Å, less than 0.6 Å, less than 0.5 Å, less than 0.4 Å, less than 0.3 Å, or less than 0.2 Å. In one embodiment, the ultrathin dopant has a layer thickness between 2.0 Å and 0.2 Å. In one embodiment, the ultrathin dopant layer has a thickness between 1.0 Å and 0.3 Å. In one embodiment, the ultrathin dopant layer has a thickness between 0.6 Å and 0.4 Å. In one embodiment, the ultrathin dopant layer has a thickness of about 0.5 Å. In one embodiment, the thickness of the ultrathin dopant layer can be considered to be an average thickness of the layer. In one embodiment, the thickness of the layer represents a fractional monolayer coverage.

Each ultrathin dopant layer comprises a dopant material. In some embodiment, the dopant material is a light emitting material and/or an emissive dopant. Any suitable dopant material known in the art may be used. The dopant material can produce light emissions via phosphorescence, fluorescence, thermally activated delayed fluorescence, i.e., TADF (also referred to as E-type delayed fluorescence), triplet-triplet annihilation, or combinations of these processes. In one embodiment, the dopant material comprises a fluorescent emitter. In one embodiment, the dopant material comprises a phosphorescent emitter. In one embodiment, the dopant material comprises more than one light emitting compound. In one embodiment, the dopant material consists of one light emitting compound. In one embodiment, the dopant material comprises a green emitter such as tris[2-phenylpyridinato-C2, N]iridium(III) (Ir(ppy)$_3$). In one embodiment, the dopant comprises a red emitter such as (2,4-pentanedionato)bis[2-(2-quinolinyl)phenyl]iridium(III) (PQIr).

There is no particular limit to the emission wavelength of the emitter in the ultrathin dopant layer. In some embodiments, a peak emission wavelength may be in the range of UV-A (300-380 nm), Violet (380-430 nm), Blue (430-500 nm), Cyan (500-520 nm), Green (520-565 nm), Yellow (565-580 nm), Orange (580-625 nm), Red (625-740 nm), near IR (740-1400 nm) or Far IR (1400-2500 nm). In devices wherein device comprises more than one ultrathin dopant layer, each ultrathin dopant layer may independently emit at the same wavelength or at the same wavelength.

The electron transporting layer (ETL) may comprise any suitable ETL material or combinations thereof. A list of exemplary ETL materials may be found in U.S. Pat. No. 5,294,870, issued Mar. 15, 1994, incorporated herein by reference. In one embodiment, the ETL comprises bathophenanthroline (Bphen). It is understood that any suitable thickness of the ETL may be used, including but not limited to 2-200 nm, 5-150 nm, 10-75 nm, 35-45 nm, about 40 nm, or any other suitable thickness.

In some embodiments, the cathode may comprise any suitable cathode material, ratio, and combination of cathode materials may be used. In one embodiment, the cathode comprises a first cathode layer and a second cathode layer, wherein the first cathode layer is positioned between the electron transporting layer and the second cathode layer, and wherein the second cathode layer is positioned above the first cathode layer. In one embodiment, the first cathode layer comprises LiQ. Any suitable thickness of first cathode layer may be used, including but not limited to 0.5-200 nm, 0.5-5 nm, 0.5-3 nm, about 2 nm, about 1.9 nm, about 1.8 nm, about 1.7 nm, about 1.6 nm, about 1.5 nm, about 1.4 nm, about 1.3 nm, about 1.2 nm, about 1.1 nm, about 1 nm, about 0.9 nm, about 0.8 nm, about 0.7 nm, about 0.6 nm, or about 0.5 nm. In one embodiment, the second cathode layer comprises aluminum (Al). Any suitable thickness of second cathode layer may be used, including but not limited to 2-200 nm, 50-150 nm, 75-125 nm, about 100 nm, or any other suitable thickness.

In one embodiment, the electronic light display is a white-light organic electroluminescent device (WOLED).

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 1 and FIG. 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, optically active metamaterials are defined as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

The CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Example 1: Hybrid White OLED with Delta-doped Phosphor Layers

Figure 8:
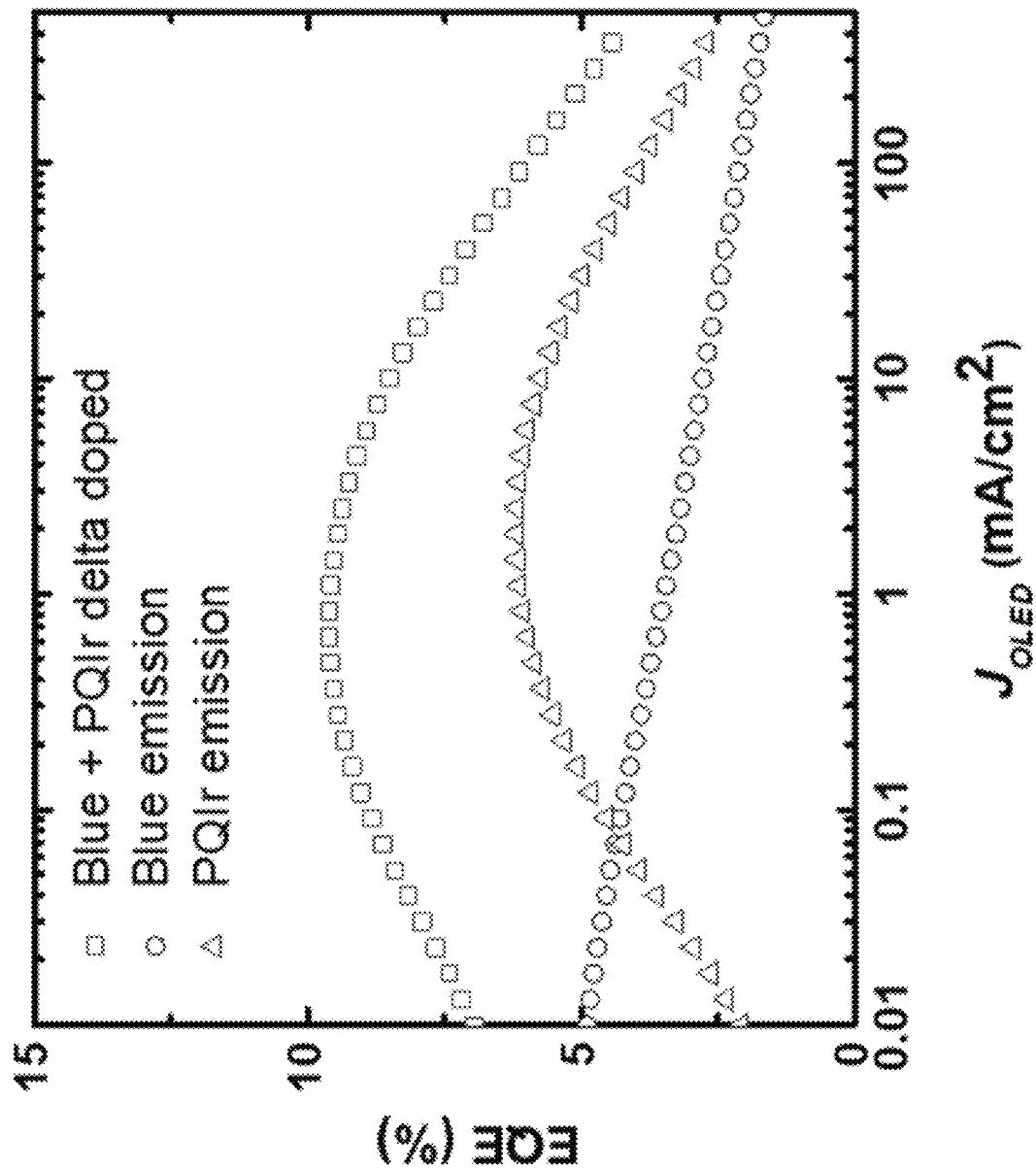
FIG. 8 is a plot of EQE versus current of device in FIG. 7B, in which blue and red emission are separated out by subtracting EQE of a blue only device with no PQIr doping.
Figure 9:
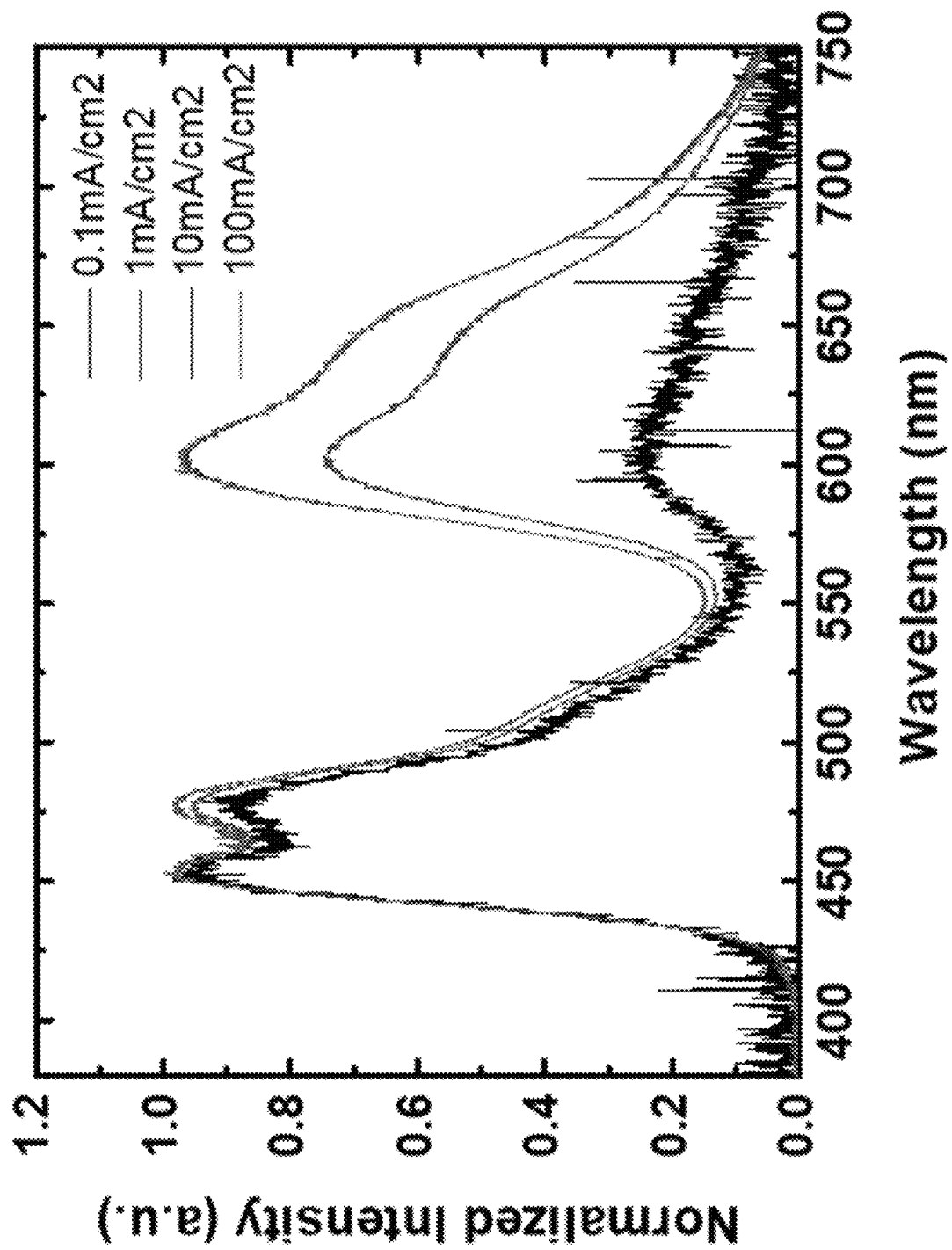
FIG. 9 shows the emission spectrum of the device in FIG. 7B at 0.1 mA/cm$^2$, 1 mA/cm$^2$, 10 mA/cm$^2$, and 100 mA/cm$^2$.

A device was prepared in which the phosphor doped layers of a hybrid white OLED shown in FIG. 7A were substituted with an ultrathin delta-doped phosphor layer (FIG. 7B). Delta-doping is part of an experimental technique currently used to map out the exciton profile in OLEDs (Lee, J. et al. Nat. Commun., 2017, 8, 1-9). In the mapping technique, ultrathin slivers of dopants are planted in different positions and relative exciton densities are obtained by quantifying dopant emission. The delta-doped layer, usually less than a monolayer thick, does not impede charge transport of the original device. Excitons are generated at the edges of the emission layer (EML) due to HOMO/LUMO level offsets between the EML host and charge transport layers in the device in FIG. 7A (Sun, Y. et al. Nature, 2006, 440, 908-912). In 7B, the phosphor doped region of 7A was replaced with a single 0.5 Å layer of (2,4-Pentanedionato) bis[2-(2-quinolinyl)phenyl]iridium(III) (PQIr). The single delta-doped layer adds up to 6% EQE to the blue only device giving a total EQE of 10% (FIG. 8), comparable to the 11% EQE achieved in the previously reported structure (Giebink, N. C., et al., Org. Electron. physics, Mater. Appl., 2006, 7, 375-386), indicating that triplet harvesting efficiency of the delta-doped OLED is as effective as a 20 nm layer with 4-5 wt % phosphor doping. The emission spectrum of the device of FIG. 7B is shown in FIG. 9. The delta doped phosphors can be thought of as an exciton filter that harvests a portion of triplet excitons and emits light while they diffuse. This result effectively shows that it is possible to emit light using a very small number of molecules, opening a potential cost saving option to commercial OLEDs.

The ultrathin delta-doped layer can be considered to represent fractional monolayer coverage, or a sub-monolayer coverage. For example, if an emitter molecule has an average diameter of 10 Å, then a delta-doped emitter layer having an average thickness of 2.0 Å represents a layer in which approximately 2 Å/10 Å=20% of the surface is coated with an emitter monolayer.

Figure 10:
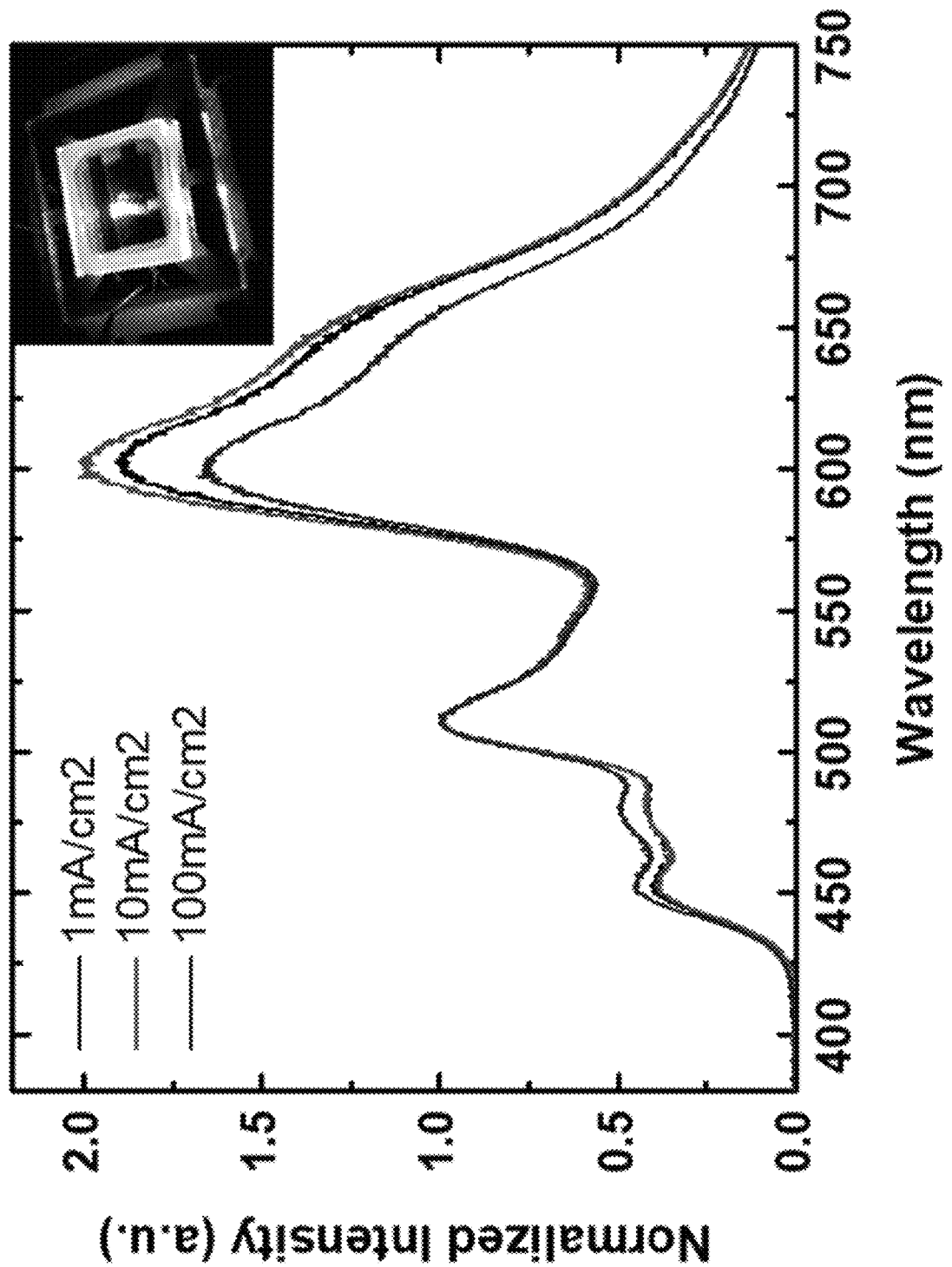
FIG. 10 shows the emission spectrum of the device of FIG. 7C at 1 mA/cm$^2$, 10 mA/cm$^2$, and 100 mA/cm$^2$; at inset is a picture of light emission at 10 mA/cm$^2$.
Figure 11:
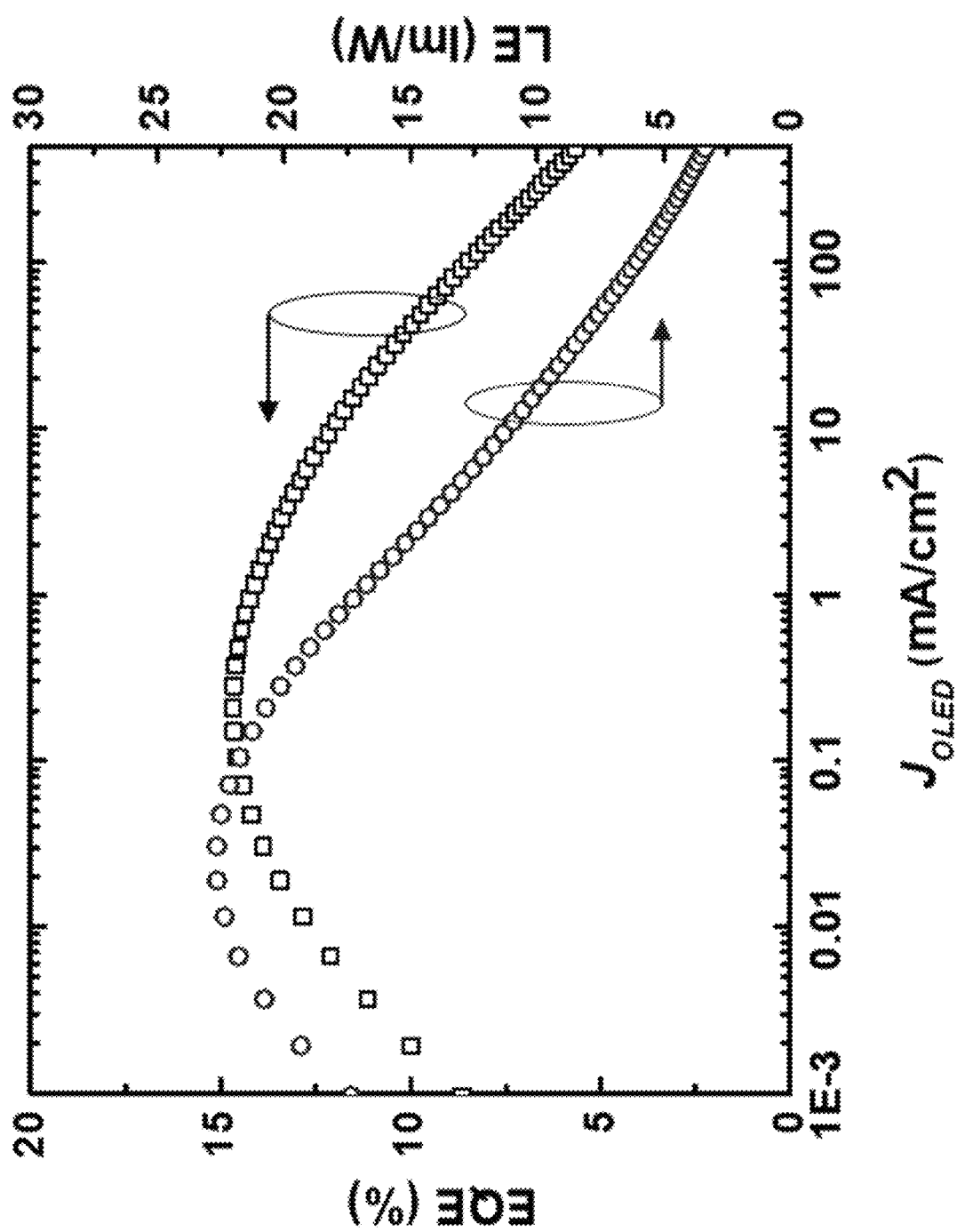
FIG. 11 plots EQE and luminous efficacy versus current of device in FIG. 7C.

A white OLED was fabricated utilizing this concept. As shown in FIG. 7C, an additional delta-doped layer of tris [2-phenylpyridinato-C2, N]iridium(III) (Ir(ppy)$_3$) was inserted in the device in FIG. 7B. This delta-doped white OLED, apart from showing slight current dependent spectrum shift where red emission decreases with increasing current (FIG. 10), emitted stable white light with a color rendering index (CRI) of 84. EQE was enhanced from 11.0±0.3% to 13.5+1.2% compared to the previously reported device with conventional phosphor doping (Sun, Y. et al. Nature, 2006, 440, 908-912) (FIG. 11). This result indicates that devices can have similar or even enhanced performance while using an infinitesimal number of molecules.

Example 2: Monochromatic OLED with Delta-doped Phosphor Layers

Figure 13:
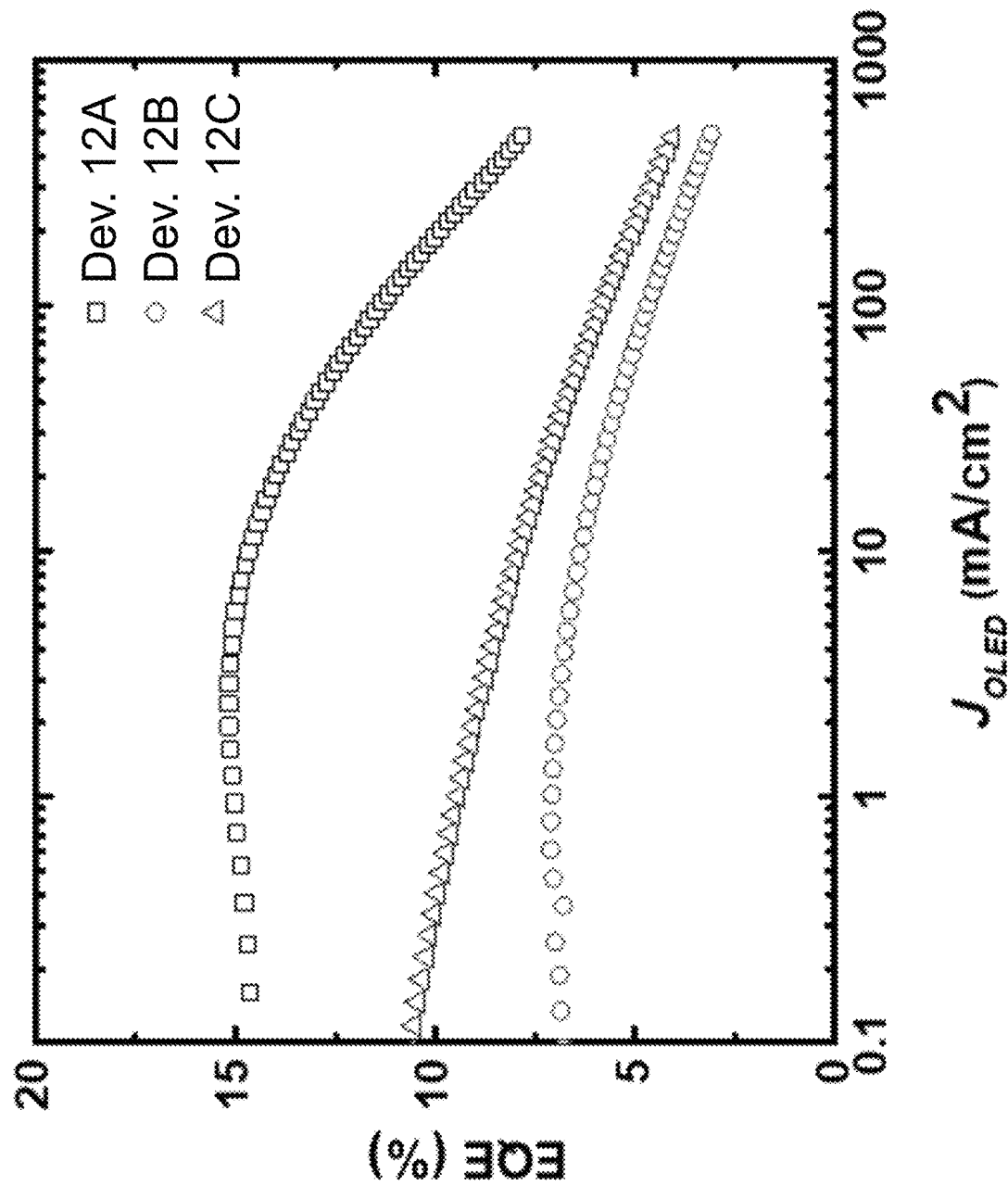
FIG. 13 plots the EQE of the devices depicted in FIGS. 12A, 12B, and 12C.
Figure 14:
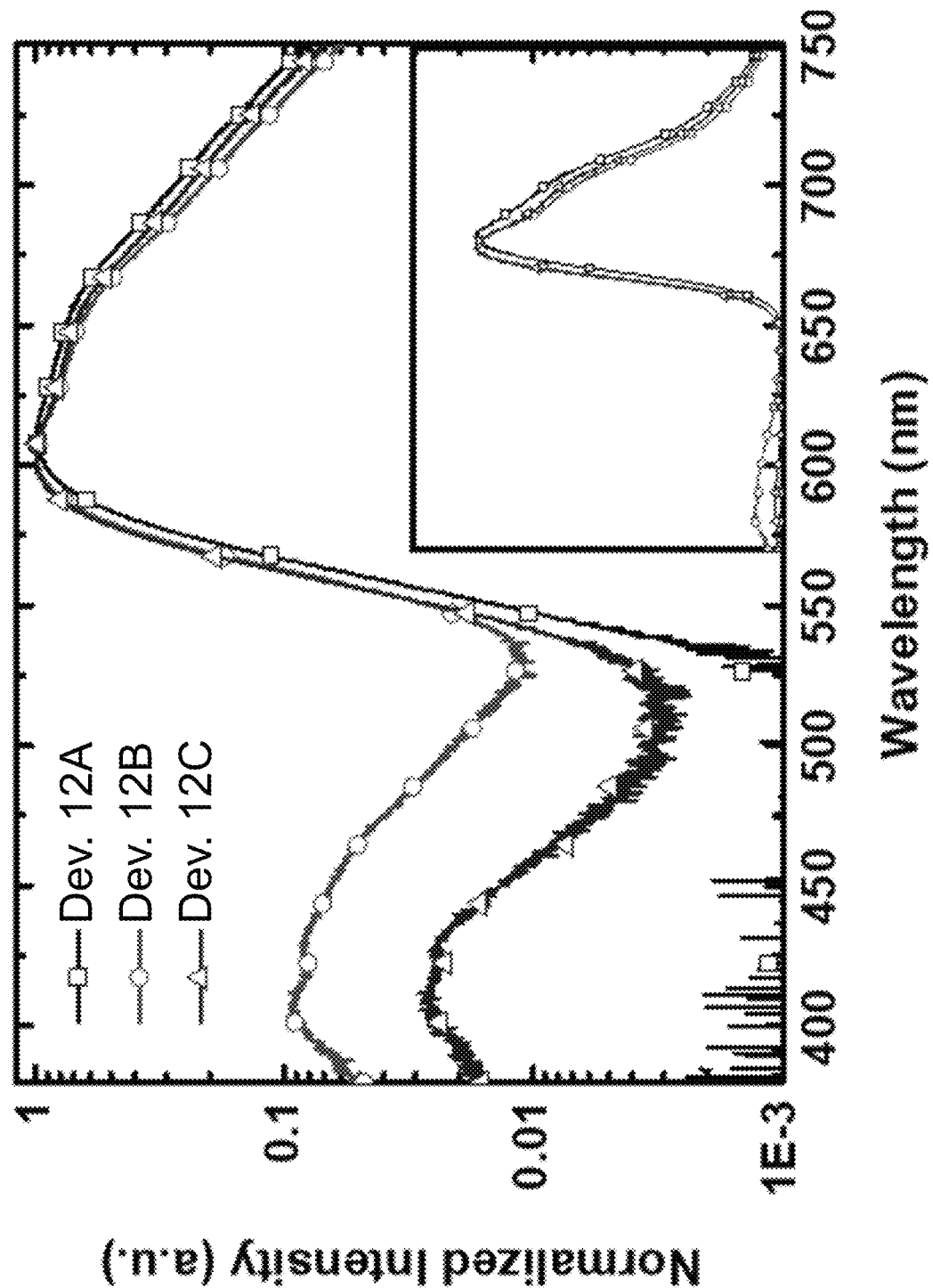
FIG. 14 plots the logarithmic scale spectra of the devices depicted in FIGS. 12A, 12B, and 12C; at inset are the respective linear scale spectra.

This 'triplet filtering' concept can potentially be extended to monochromatic OLEDs to achieve similar performance while using much less material. A red OLED with 8 vol % doping was fabricated as a control device as shown in FIG. 12A. A total volume of 44 Å of PQIr was used to fabricate this device with a maximum EQE of 15.1±0.1% (FIG. 13). The device in FIG. 12B with two delta-doped PQIr layers has maximum EQE of 7.1±0.06%. This device, however, displays host 4,4'-Bis(N-carbazolyl)-1,1'-biphenyl (CBP) emission at 420 nm indicating singlet emission at the EML edges (FIG. 14). A third device was fabricated to address this singlet loss. Two additional delta-doped layers were inserted 3 nm away from the edges in the EML edges to collect singlets (FIG. 12C). The additional layers enhance EQE to 11.2±0.2%. However, a trace of CBP emission is still detected as seen in FIG. 14, indicating that either the amount of PQIr is insufficient to collect all singlets or the singlet emission zone is wider than expected. CBP emission can be further suppressed by increasing dopant thickness or by planting additional delta-doped layers. A figure of merit of EQE divided by dopant volume is assumed to assess the performance of these devices. The conventional red PHOLED has a figure of merit of 0.34 whereas the two delta-doped red PHOLEDs have 7.1 and 5.6. This indicates that efficient light emission can be realized while minimizing the amount of dopants, offering a potential cost reduction in OLED fabrication.

The disclosures of each and every patent, patent application, and publication cited herein are hereby incorporated herein by reference in their entirety. While devices and methods have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

The invention claimed is:

1. An organic electroluminescent device, comprising:
   a first electrode;
   a first neat host material layer positioned over the first electrode;
   a second neat host material layer positioned over the first host material layer;
   at least one ultrathin dopant layer positioned between the first and second host material layers, the at least one ultrathin dopant layer having a thickness of less than 2 Å, positioned at a distance of 20-200 nm from a bottom surface of the first host material layer or a top surface of the second host material layer; and
   a second electrode positioned over the second host material layers.

2. The organic electroluminescent device of claim 1, further comprising:
   a third host material layer positioned between the second host material layer and the second electrode; and
   at least one second ultrathin dopant layer positioned between the second and third host material layers.

3. The organic electroluminescent device of claim 1, further comprising a hole transport layer positioned between the first electrode and the first host material layer.

4. The organic electroluminescent device of claim 1, wherein the first host material layer has a thickness different from a thickness of the second host material layer.

5. The organic electroluminescent device of claim 1, wherein the first or second host material layer comprises CBP.

6. The organic electroluminescent device of claim 1, wherein the at least one ultrathin dopant layer comprises a first ultrathin dopant layer and a second ultrathin dopant layer.

7. The organic electroluminescent device of claim 6, wherein the first ultrathin dopant layer and a second ultrathin dopant layer comprise different dopant materials.

8. The organic electroluminescent device of claim 6, wherein the first ultrathin dopant layer is in contact with the second ultrathin dopant layer.

9. The organic electroluminescent device of claim 1, wherein the first electrode is an anode and the anode is a transparent anode.

10. The organic electroluminescent device of claim 1, wherein the at least one dopant layer has a thickness of less than 1 Å.

11. The organic electroluminescent device of claim 1, further comprising a first emissive layer positioned over the first electrode, comprising an emissive layer host material and an emissive layer dopant material, wherein the emissive layer dopant material is different than a dopant in the at least one ultrathin dopant layer.

12. The organic electroluminescent device of claim 11, wherein the first emissive layer is positioned between the first electrode and the first host material layer.

13. The organic electroluminescent device of claim 11, wherein the emissive layer dopant material and the at least one ultrathin dopant layer are each independently selected from the group consisting of a red emissive layer, a blue emissive layer, and a green emissive layer.

14. The organic electroluminescent device of claim 1, wherein the first host material layer has a thickness of between 3 nm and 4 nm.

15. The organic electroluminescent device of claim 1, wherein the at least one ultrathin dopant layer is positioned at a distance of 20-50 nm from the bottom surface of the first host material layer or the top surface of the second host material layer.

16. An organic electroluminescent device, comprising:
a first electrode;
a first neat host material layer comprising a first host material positioned over the first electrode,
a light emitting layer positioned over the first host material; and
a second neat host material layer comprising a second host material positioned over the light emitting layer;
wherein the light emitting layer comprises:
n ultrathin dopant layers, each dopant layer having a thickness of at less than 2 Å and comprising a dopant material, wherein at least one of the ultrathin dopant layers is positioned at a distance of 20-50 nm from a bottom surface of the first host material layer; and
m additional host material layers, each additional host material layer comprising an additional host material;
wherein n is an integer of at least 1; and
wherein m=n−1 and when m>0, each additional host material layer is positioned between two ultrathin dopant layers.

17. The organic electroluminescent device of claim 16, wherein n is at least 2 and at least one dopant material is different from at least one other dopant material.

18. The organic electroluminescent device of claim 16, wherein n is at least 2, and each dopant material is the same.

19. An organic electroluminescent device, comprising:
a first electrode;
a second electrode positioned over the first electrode;
a neat layer of host material positioned between the first electrode and the second electrode, having a bottom surface facing the first electrode and a top surface facing the second electrode; and
a thin layer of dopant material positioned within the layer of host material, the layer of dopant material having a thickness of less than 2 Å, and positioned at a distance of 20-50 nm from the bottom surface of the layer of host material.

20. The organic electroluminescent device of claim 19, further comprising a second thin layer of dopant material positioned within the layer of host material, the second layer of dopant material having a thickness of less than 2 Å and positioned at a distance of 20-50 nm from the top surface of the layer of host material.

* * * * *